United States Patent [19]
Gray

[11] 3,770,983
[45] Nov. 6, 1973

[54] HIGH-SPEED HIGH-SENSITIVITY THRESHOLD DETECTOR

[75] Inventor: James S. Gray, Indiatlantic, Fla.

[73] Assignee: Harris-Intertype Corporation, Cleveland, Ohio

[22] Filed: Oct. 12, 1971

[21] Appl. No.: 188,365

[52] U.S. Cl.............. 307/235 R, 307/237, 328/171, 330/30 D
[51] Int. Cl....... H03k 5/20, H03k 5/08, H03k 5/153
[58] Field of Search.................... 307/235, 237, 280, 307/290, 300; 328/146, 147, 171; 330/30 D

[56] References Cited

UNITED STATES PATENTS

| | | | |
|---|---|---|---|
| 3,584,231 | 6/1971 | Dorward | 307/291 X |
| 3,527,961 | 9/1970 | Palini | 307/235 |
| 3,610,962 | 10/1971 | Keene et al. | 307/235 X |
| 3,551,836 | 12/1970 | Greeson, Jr. | 330/30 D |
| 3,617,907 | 11/1971 | Garzon | 307/237 X |
| 3,405,286 | 10/1968 | Mudie | 307/288 X |
| 2,821,629 | 1/1958 | Finkel et al. | 307/237 X |
| 3,183,371 | 5/1965 | Trampel | 307/280 X |
| 3,237,019 | 2/1966 | Fitzgerald | 307/237 |
| 3,350,578 | 10/1967 | Carter et al. | 307/237 X |
| 3,366,889 | 1/1968 | Avins | 307/237 X |
| 3,610,956 | 10/1971 | Giordano | 307/235 R |

OTHER PUBLICATIONS

Millman & Taub, Pulse, Digital, and Switching Waveforms, p. 761–762, McGraw-Hill Book Co., 1965.

Brenner & Javid, Analysis of Electric Circuits, p. 186–209, McGraw-Hill, Inc., 1967.

Millman & Taub; Pulse, Digital and Switching Waveforms, p. 242, 243; McGraw-Hill Book Co. 1965.

Skarshinski, "Amplitude Limiting Amplifier," IBM Technical Disclosure Bull.; Vol, 8, No. 6, p. 920, 11/1965.

*Primary Examiner*—John W. Huckert
*Assistant Examiner*—L. N. Anagnos
*Attorney*—Donald R. Greene

[57] ABSTRACT

A two stage threshold detector in which the first stage is used for buffering and stabilization and the second stage constitutes a current mode switch. The first stage - second stage interface is a network having a configuration and component value selected to optimize the speed of response of the current mode switch to input voltage transitions through the threshold level. The input circuit of the current mode switch is clamped at the upper and lower limits of a preselected linear voltage range to prevent damage to the overall detector circuit in the event of input voltage levels exceeding these limits.

7 Claims, 2 Drawing Figures

HIGH-SPEED HIGH-SENSITIVITY THRESHOLD DETECTOR

BACKGROUND OF THE INVENTION

The present invention relates generally to analog to digital (A/D) conversion apparatus. More particularly, the invention is directed to a threshold detector which is capable of rapidly responding to the variation of an analog input signal through a preselected voltage level to generate an appropriate digital output in binary logic format.

SUMMARY OF THE INVENTION

Briefly, the invention involves a threshold detector comprising a two stage transistor amplifier circuit in which the first stage is a buffer including a pair of differentially coupled transistors and associated components for comparing an analog input voltage with a preselected threshold level, and the second stage is a current mode switch including a pair of differentially coupled transistors whose input electrodes are clamped such that the switch operates only in response to input voltages within a preselected range. The current mode switch is configured and operates such that when one of its transistors is "on" the other is concurrently "off" and a binary 0 is generated, while when the latter transistor is "on" and the first transistor is "off" a binary 1 is generated.

The crux of the invention resides in the recognition that the speed of response and the sensitivity of the switch depends upon what the input voltage "sees" looking into the switch stage, which in turn depends in large measure upon the characteristics of the first stage - second stage interface. This ignores the usual technique of maximizing gain-bandwidth (or, what is the same thing, gain divided by risetime). It is an accompanying and important feature of the invention that the interface between the buffer stage and the current mode switch contains an effective value of resistance which has been maximized to provide high impedance drive for the switch, while the input circuit of the switch is concurrently clamped by hot carrier diodes to prevent operation outside a specified input voltage range.

BRIEF DESCRIPTION OF THE DRAWINGS:

The above and other objects, features and advantages of the invention will be better understood from the following detailed description of a preferred embodiment, with reference too the accompanying figures of drawing, in which.

Figure 1:
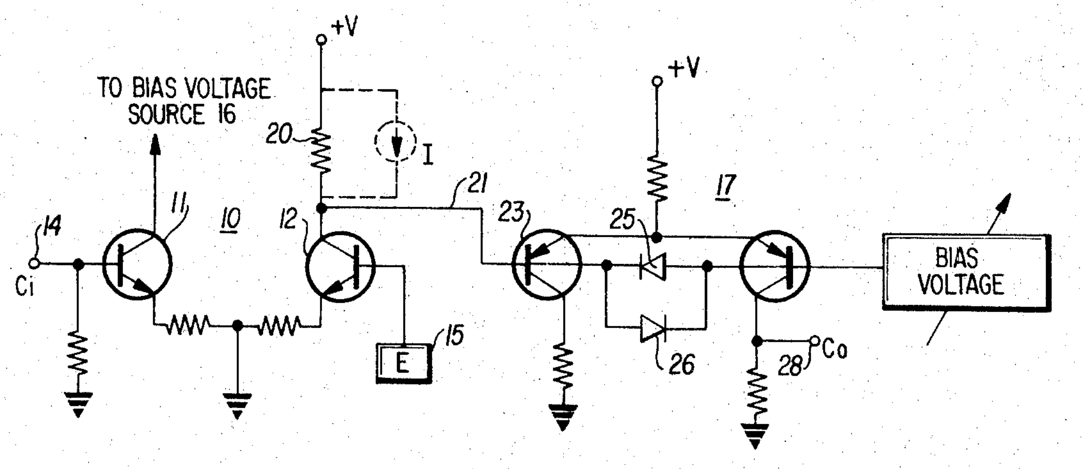
FIG. 1 is a circuit diagram of the preferred embodiment.

DESCRIPTION OF THE PREFERRED EMBODIMENTS:

Referring to FIG. 1, the first stage 10 of the threshold detector is a buffer comprising a pair of NPN transistors 11, 12 connected in conventional differential configuration. An input voltage $e_i$ is applied to terminal 14 and thus to the base of transistor 11 while a voltage decision level (i.e., a threshold voltage) E is connected to the base of transistor 12. The voltage E simply constitutes a reference against which the input voltage $e_i$ is compared.

The collector of transistor 11 preferably works into an ac low impedance and is therefore connected to a bias voltage source 16 coupled to the second stage 17 of the detector. A large-valued resistor 20 is connected as a load to the collector of transistor 12 from the +V supply. Alternatively, the resistor 20 may be connected in parallel circuit with a current source I, shown in dotted lines in FIG. 1. With the differential configuration of the buffer stage 10, the output voltage at 21 is the difference between the voltages applied to the bases of transistors 11 and 12. Accordingly, it is clear that rather than using the circuit as a threshold detector in the conventional sense, the transistors 11, 12 may be driven by differential voltages to produce an output at 21 which is effectively a comparison about a differential level of zero.

Several additional points should be emphasized concerning the buffer stage 10. First, there is no small signal collector load for transistor 11. The collector of the latter transistor is connected directly to a bias voltage source. Second, the base of transistor 12 is connected directly to the threshold voltage source, and therefore is connected to ground for time varying signals (i.e., is an ac short circuit). Since the base of transistor 12 is connected to ground under small signal conditions, the small signal transient response of the buffer stage is optimized and the effect of loading at the collector of transistor 12 is minimized. Third, and of perhaps greatest importance, the resistance value of resistor 20 is preferably as large as possible, considering other design factors, to enhance the speed of the current mode switch which is the second stage 17 of the threshold detector.

Figure 2:
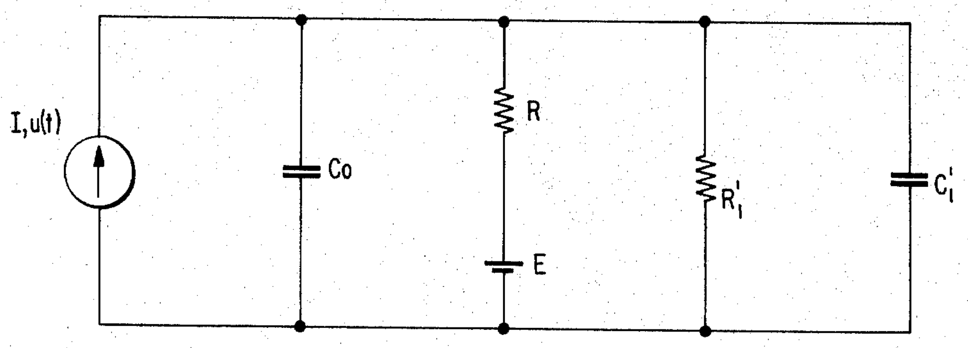
FIG. 2 is a simplified equivalent network for a portion of the circuit of FIG. 1.

With reference to the latter point, a simplified network representation for the first stage - second stage interface is shown in FIG. 2. The output of common base - connected transistor 12 is represented by a current source $I_1$ ($t$) and a capacitance $C_o$. The input impedance of the current mode switch may for present purposes by accurately represented by a parallel RC network composed of resistance $R_1'$ and capacitance $C_1'$, despite the fact that the switch input impedance is actually somewhat more complex than a parallel RC network. The resistance R in the simplified network of FIG. 2 is resistor 20 of FIG. 1 and the source E is the threshold voltage level.

It can be shown that the time $t_1$ for $e_o$, the voltage across the parallel network, to change from zero to the fixed value E is $$t_1 = R_1C_1 \ 1n(I_1R_1/I_1R_1-E) \qquad E<I_1R_1$$

where $R_1$ is the parallel combination of resistances R and $R_1'$ and $C_1$ is the parallel combination of capacitances $C_0$ and $C_1'$, and $R_1$ and $C_1$ are in parallel circuit. The above expression implies that maximizing $R_1$ minimizes $t_1$, as is expected since $I_1$ would then flow virtually entirely through the branch $C_1$, and this is valid for even more complex representations of the input impedance of current mode switch 17. In contrast, the application of standard gain-bandwidth concepts implies that for fixed $I_1$ the gain-bandwidth product is constant for any value of resistance $R_1$. This is equivalent to stating that gain divided by rise time is constant for any value of resistance $R_1$, a result which leads away from the present invention. In accordance with the invention the most expedient method of maximizing $R_1$ is to make R (resistance 20, FIG. 1) as large as possible taking into account other considerations of normal circuit design.

As previously stated, and with reference again to FIG. 1, it may be desirable under some conditions to use a current source (I) in parallel with resistance 20 to satisfy the dc requirement while permitting that resistance to be large enough to provide optimum performance. With or without the current source, however, the large value of resistance 20 may tend to create a steady state voltage change sufficiently great to saturate transistor 12 or to produce avalanche conditions at the base-emitter junction of transistor 23 of current mode switch 17. In order to restrict the operation of the circuit to an adequate desired linear region and to optimize the rate of change of current from transistor 12 in regions outside the transition region of the current mode switch, a pair of oppositely poled hot carrier diodes 25, 26 are connected between the base electrodes of the differentially connected, PNP (opposite conductivity type, or complementary, relative to the first stage) transistors 23, 24 of the switch. These diodes are used to clamp the bases of the latter transistors to the limits of the desired linear voltage range. Preferably, the diodes are selected to have quite low storage times (e.g., 100 picoseconds) and low capacitance (e.g., 1 picofarad. The clamp voltage is equivalent to the forward bias voltage of each diode. Thus, for example, if each diode's forward voltage is about 300 millivolts, then the input voltage variation at the base of transistor 23 for single ended drive of the switch as shown in FIG. 1 (with bias voltage source 16 providing an ac short to ground for the base of transistor 24) is ±300 millivolts. If the current mode switch is driven differentially, i.e., such that the output of the buffer stage is supplied to the base of each of transistors 23 and 24, the clamping diodes restrict the voltage to the same aforementioned range.

The bias voltage level of source 16 is set such that when the input voltage level is equal to the threshold level (i.e., $e_i = E$) the output at terminal 28 is midway between a binary logical 1 and a binary logical 0. In operation, if the input voltage at terminal 14 is greater than the threshold level (i.e., $e_i > E$), one of transistors 23, 24 is turned on and the other remains off (where the on and off condition is defined by the collector currents of the two transistors being in the ratio of 100 to 1 or greater). In that event, the output $e_o$ at terminal 28 is a logical 1, for example. If $e_i$ is less than E, the on-off condition of transistors 23, 24 of switch 17 is reversed, i.e., the aforementioned one is turned off and the other is turned on, and the output $e_o$ is a logical 0. A transition region exists between the two states at about 1 precent or less of the clamped voltage range for an input voltage $e_i$ at either side of the threshold level E. It has been observed that the switching time for a threshold detector according to the invention is of the order of a nanosecond.

It will be obvious from the above detailed description of a preferred embodiment that modifications may be made without departing from the spirit and scope of the invention. For example, the change of transistor conductivity types in the buffer and switch stages, and the change from single ended to differential drive of the switch are obvious to those skilled in the art to which the invention pertains.

What is claimed is:

1. A threshold detector comprising a pair of differentially connected transistors for comparing an input voltage level applied to an electrode of one of said transistors to a threshold voltage level applied to the corresponding electrode of the other of said transistors, an output load for said other transistor for developing a component of voltage thereacross representative of the difference between said voltage levels, said output load comprising current control means for producing a substantially constant current including a constant current source, a second pair of transistors responsive to said difference component of voltage and connected for operation in a first state in which one of said transistors of the second pair is on and the other is off when said input voltage level is greater than said threshold voltage level and for operation in a second state in which said one of said transistors of the second pair is off and the other is on when said input voltage level is less than said threshold level, to generate a first binary digital output upon operation in said first state and a second binary digital output upon operation in said second state, and having means interconnecting said transistors of said second pair of transistors including a pair of oppositely poled clamping diode connected in parallel and connected directly between corresponding input electrodes of said second pair of transistors to restrict operation thereof within a given voltage range of said difference component of voltage for preventing overloading of said second pair of transistors.

2. The threshold detector according to claim 1, wherein said output load is purely resistive.

3. The threshold detector according to claim 1, wherein said output load further comprises a passive resistance component in parallel circuit with a constant current generator.

4. A voltage comparator network, comprising a buffer stage responsive to the difference and sense of two separate input voltage levels to generate an output voltage component having a magnitude and a polarity representative of said difference and sense, a current mode switch having an input first transistor and an output second transistor, and responsive to said output difference voltage component of said buffer stage to generate a binary output of one form for one polarity of said output difference voltage component and a binary output of the opposite form for the opposite polarity of said output difference voltage component, voltage clamping means connecting the base of said input first transistor to the base of said output second transistor of said current mode switch to establish a range of maximum voltage differences of either polarity between the bases of said input first transistor and output second transistor, and an interface circuit between said buffer stage and said current mode switch across at least a part of which said output voltage component of said buffer stage is developed, said part including a source of substantially constant current.

5. The voltage comparator according to claim 4, wherein said part further includes a resistance in parallel circuit with said current source.

6. A threshold detector comprising:

a first pair of differentially connected transistors for comparing an input voltage level applied to an electrode of one of said transistors to a threshold voltage level applied to the corresponding electrode of the other of said transistors, an output load circuit for said other transistor for developing a third voltage thereacross representative of the difference between said voltage levels, current mode switch means for comparing said third voltage with a reference potential and exhibiting a first binary state when said third voltage is greater than said reference potential and a second binary state when said third voltage is less than said reference potential, output circuit means for providing a binary digital output signal of a first or second binary level in dependence upon the binary state of said switch means, said switch means including first and second transistors of a like conductivity type, circuit means interconnecting said transistors so that when said switch means is in said first state one of said first and second transistors is on and the other is urged thereby toward an off condition and when said switch means is in said second state the other of said transistors is on and the one transistor is urged thereby toward an off condition, a pair of oppositely poled diodes connected in parallel, circuit means connecting said parallelly connected diodes directly between the base electrodes of said first and second transistors of said switch means, each of said diodes exhibiting a forward voltage characteristic in excess of the required voltage difference between said third voltage and said reference potential to actuate said switching means from one said binary state to the other of said binary states for permitting switching operation of said transistors while at the same time limiting the difference between base voltages applied to said transistors to a level dependent on said forward voltage characteristics, said output load circuit comprising current generator means for producing a substantially constant current in said output load circuit.

7. A threshold detector as set forth in claim 6 wherein said diodes exhibit the characteristics of having low storage time on the order of 100 picoseconds and low capacitance on the order of 1 picofarad and that the forward voltage characteristic of each said diode is on the order of 300 millivolts.

* * * * *